(12) United States Patent
De Lyon et al.

(10) Patent No.: US 9,466,746 B1
(45) Date of Patent: Oct. 11, 2016

(54) COMPOUND-BARRIER INFRARED PHOTODETECTOR

(71) Applicant: HRL Laboratories, LLC, Malibu, CA (US)

(72) Inventors: Terence J De Lyon, Newbury Park, CA (US); Rajesh D Rajavel, Oak Park, CA (US); Hasan Sharifi, Agoura Hills, CA (US)

(73) Assignee: HRL Laboratories, LLC, Malibu, CA (US)

(*) Notice: Subject to any disclaimer, the term of this patent is extended or adjusted under 35 U.S.C. 154(b) by 0 days.

(21) Appl. No.: 15/043,038

(22) Filed: Feb. 12, 2016

Related U.S. Application Data

(62) Division of application No. 14/453,772, filed on Aug. 7, 2014, now Pat. No. 9,293,612, which is a division of application No. 13/152,896, filed on Jun. 3, 2011, now Pat. No. 8,835,979.

(60) Provisional application No. 61/351,372, filed on Jun. 4, 2010, provisional application No. 61/351,368, filed on Jun. 4, 2010.

(51) Int. Cl.

| | |
|---|---|
| *H01L 31/11* | (2006.01) |
| *H01L 31/102* | (2006.01) |
| *H01L 31/0304* | (2006.01) |
| *H01L 31/0352* | (2006.01) |
| *H01L 31/0296* | (2006.01) |
| *H01L 31/109* | (2006.01) |
| *H01L 27/146* | (2006.01) |
| *H01L 31/103* | (2006.01) |
| *H01L 31/18* | (2006.01) |

(52) U.S. Cl.
CPC . *H01L 31/035272* (2013.01); *H01L 27/14649* (2013.01); *H01L 27/14652* (2013.01); *H01L 31/0296* (2013.01); *H01L 31/03046* (2013.01); *H01L 31/035236* (2013.01); *H01L 31/109* (2013.01); *H01L 31/1035* (2013.01); *H01L 31/11* (2013.01); *H01L 31/1105* (2013.01); *H01L 31/1844* (2013.01)

(58) Field of Classification Search
CPC ........ H01L 31/11–31/1105; H01L 31/035236; H01L 31/03046; H01L 31/1844; H01L 27/14649–27/14652
See application file for complete search history.

(56) References Cited

U.S. PATENT DOCUMENTS

| | | | | |
|---|---|---|---|---|
| 7,745,816 | B2 * | 6/2010 | Mohseni | H01L 27/14643 257/12 |
| 7,820,971 | B2 * | 10/2010 | Velicu | H01L 31/1032 250/338.4 |
| 8,093,559 | B1 * | 1/2012 | Rajavel | H01L 31/03046 250/330 |
| 8,399,910 | B2 * | 3/2013 | Scott | H01L 27/14603 257/184 |
| 8,835,979 | B1 * | 9/2014 | De Lyon | H01L 31/101 257/184 |
| 2004/0150002 | A1 * | 8/2004 | Grein | B82Y 20/00 257/184 |

(Continued)

*Primary Examiner* — Marvin Payen
*Assistant Examiner* — Jeremy Joy
(74) *Attorney, Agent, or Firm* — George R. Rapacki; Albert T. Wu

(57) ABSTRACT

Using a multiple layer, varied composition barrier layer in place of the typical single layer barrier layer of an infrared photodetector results in a device with increased sensitivity and reduced dark current. A first barrier is adjacent the semiconductor contact; a second barrier layer is between the first barrier layer and the absorber layer. The barrier layers may be doped N type or P type with Beryllium, Carbon, Silicon or Tellurium. The energy bandgap is designed to facilitate minority carrier current flow in the contact region and block minority current flow outside the contact region.

9 Claims, 6 Drawing Sheets

(56) References Cited

U.S. PATENT DOCUMENTS

| | | | |
|---|---|---|---|
| 2007/0215900 A1* | 9/2007 | Maimon | B82Y 20/00 257/184 |
| 2007/0235758 A1* | 10/2007 | Klipstein | H01L 31/101 257/188 |
| 2009/0127462 A1* | 5/2009 | Gunapala | B82Y 20/00 250/338.4 |
| 2010/0072514 A1* | 3/2010 | Ting | H01L 31/0304 257/184 |
| 2010/0233842 A1* | 9/2010 | Grein | B82Y 20/00 438/93 |
| 2011/0037097 A1* | 2/2011 | Scott | B82Y 20/00 257/184 |
| 2012/0295108 A1* | 11/2012 | Nishi | H01B 1/04 428/368 |

* cited by examiner

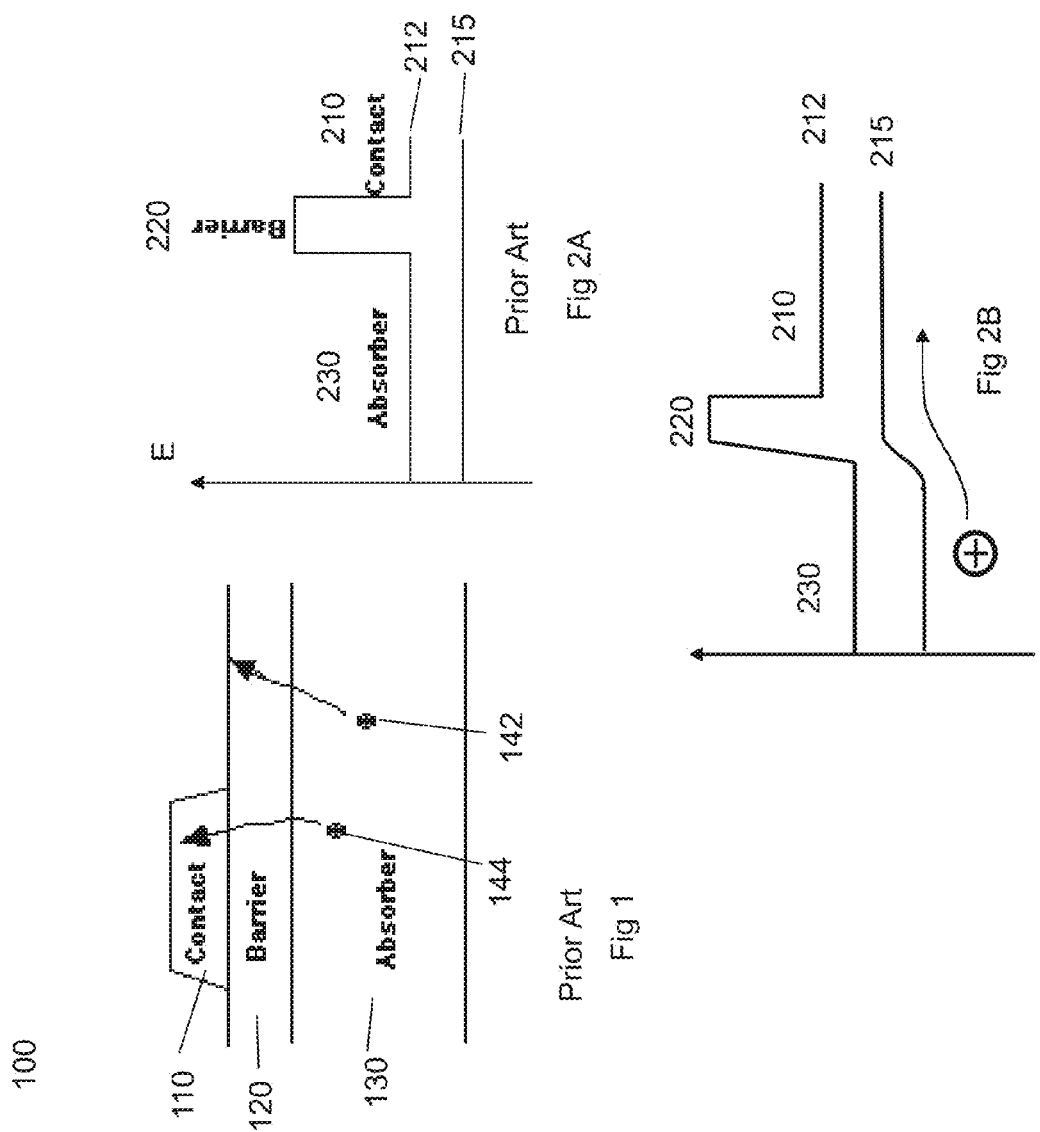

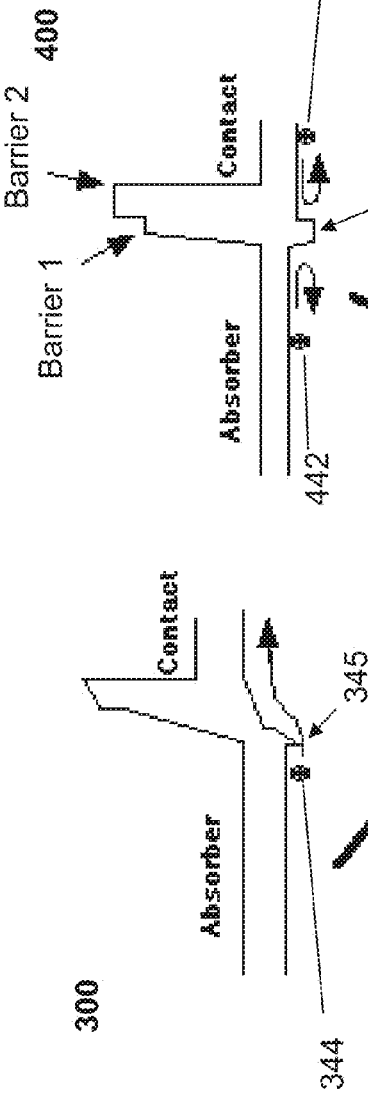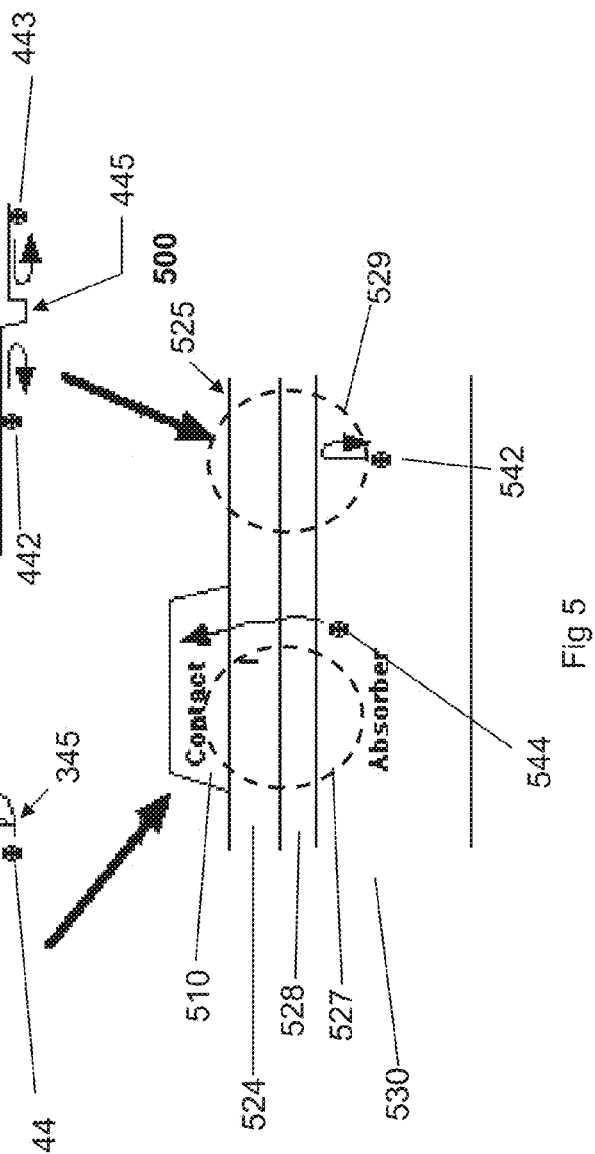

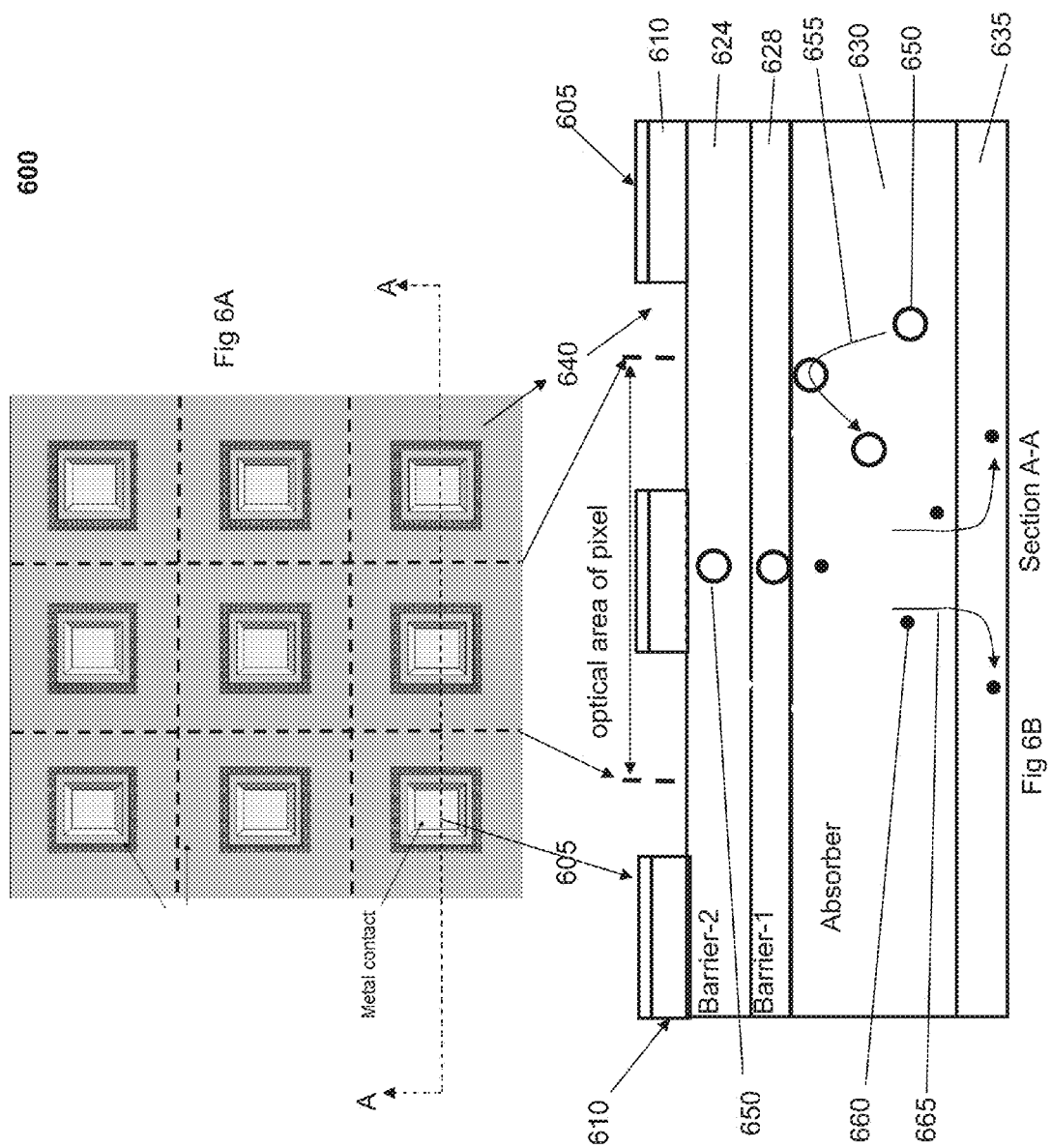

COMPOUND-BARRIER INFRARED PHOTODETECTOR

This application is a divisional application of U.S. application Ser. No. 14/453,772, filed on Aug. 7, 2014, and titled "Compound Barrier Infrared photodetector," which is in turn a divisional application of U.S. application Ser. No. 13/152,896, filed on Jun. 3, 2011, and titled "Compound Barrier Infrared Photodetector," which has now issued as U.S. Pat. No. 8,835,979, and which claims the benefit of U.S. Provisional Application Nos. 61/351,372 and 61/351,368, titled "Compound Barrier Infrared Photodetector" and "Electrostatic Barrier Infrared Photodetector" respectively, both filed on Jun. 4, 2010, each of which are incorporated by reference herein.

STATEMENT REGARDING FEDERALLY SPONSORED RESEARCH OR DEVELOPMENT

This invention was made with support from the United States Government under Contract No. S9 004726 awarded by the U.S. Government. The Government has certain rights in the invention.

FIELD OF THE INVENTION

The present technology relates to an apparatus and method for improving the sensitivity of a infrared photodetector while also reducing the dark current.

BACKGROUND OF THE INVENTION

Typical designs for an infrared photodetector for a focal plane array comprise a "barrier" layer of constant alloy composition, whose composition is specifically chosen to produce a near-zero valence-band offset in order to obtain high-efficiency collection of photogenerated minority carriers. The prior-art devices are optimized for high-efficiency collection of photogenerated charge in the bulk of the device, but fail to provide mechanisms to minimize the effects of surface recombination/generation in the periphery outside the influence of the semiconductor contact, which is especially critical for devices utilizing small (<25 μm) pixels, with reduced junction areas, in practical focal-plane arrays. The effect of the surface recombination/generation in the periphery shows up in the dark current. In addition, these prior-art devices rely upon very wide bandgap AlAsSb alloys in the barrier layer, which are difficult to controllably dope, leading to variations in electric field in the narrow-bandgap absorber region of the detector structure.

Furthermore, prior art devices are not designed to ensure depletion-free, flat-band conditions in the absorber. In order to ensure flat-band conditions in the absorber, a compound barrier has to be incorporated such that the electric field in the absorber can be tailored by adjusting the doping in the barrier layer located adjacent to the absorber.

SUMMARY OF THE INVENTION

The principles of the present invention are embodied in a compound barrier infrared photodetector comprising: a photo absorber layer responsive to infrared light, a first barrier layer disposed on the absorber layer, a second barrier layer disposed on the first barrier layer, and a contact layer disposed on the second barrier layer. The first barrier layer may comprise $Al_yIn_{1-y}As_xSb_{1-x}$, y is between 0 and 1, x is between, 0.05 and 0.30 and the second barrier layer may comprise $AlAs_zSb_{1-z}$, where z is between 0 and 0.15.

The previously described embodiment of a compound barrier infrared photodetector may further comprise a first barrier layer doped to a concentration between 1.0E14 and 1.0E18 per $cm^3$, wherein the doping is N type. The previously described embodiment of a compound barrier infrared photodetector may further comprise a doped second barrier layer.

In an alternative embodiment, either previously described compound barrier infrared photodetector wherein the doping of the first barrier layer is P type at a concentration of 1.0E14 to 1.0E18 per $cm^3$.

The previously described compound barrier infrared photodetector may comprise a first barrier layer thickness between 10 nm and 200 nm, preferably 15 nm. Furthermore, the second barrier layer thickness may be between 50 nm and 300 nm, preferably 200 nm.

In an alternative embodiment the compound barrier infrared photodetector may comprise: an absorber layer responsive to infrared light a first barrier layer disposed on the absorber layer, a second barrier layer disposed on the first barrier layer; a contact layer disposed on the second barrier layer in a first region, wherein the first barrier layer and the second barrier layer are selected to provide a first minority carrier barrier outside the first region such that minority carrier transport is substantially blocked, and a second minority carrier barrier within the first region that allows minority carrier transport when a reasonable bias voltage is applied to the contact layer relative to the absorber layer. The first barrier layer may comprise a III-V semiconductor alloy selected from the AlGaInPAsSb family of semiconducting alloys. Moreover, the first barrier layer has a bandgap less than 1.5 electron-volts and is doped N-type to a concentration between 1.0E14 and 1.0E18 cm-3 such that the absorber layer has a zero-bias electric field less than 10,000 V/cm.

In an alternative embodiment, a compound barrier infrared photodetector may comprise: a photo absorber layer responsive to infrared light, a first barrier layer disposed on the absorber layer, a second barrier layer disposed on the first barrier layer, a contact layer disposed on the second barrier layer. The first barrier layer may comprise $AlAs_zSb_{1-z}$, where z is between 0 and 0.15; and the second barrier layer may comprise $Al_yIn_{1-y}As_xSb_{1-x}$, where y is between 0 and 1, x is between 0.05 and 0.30.

In an alternative embodiment, a compound barrier infrared photodetector comprising: an absorber layer responsive to infrared light, a first barrier layer disposed on the absorber layer, a second barrier layer disposed on the first barrier layer, a contact layer disposed on the second barrier layer in a first region, wherein the first barrier layer and the second barrier layer are each selected to allow minority carrier transport both outside and inside the first region. The minority carrier transport outside the first region is substantially blocked when a reasonable bias voltage is applied to the contact layer relative to the absorber layer. Moreover, the first barrier layer comprises a III-V semiconductor alloy selected from the AlGaInPAsSb family of semiconducting alloys. In addition, the first barrier layer has a bandgap less than 1.5 electron-volts and is doped N-type to a concentration between 1.0E14 and 1.0E18 cm-3 such that the absorber layer has a zero-bias electric field less than 10,000 V/cm.

In an alternative embodiment, a compound barrier infrared photodetector may comprise: a photo absorber layer responsive to infrared light, a first barrier layer of a first semiconductor material disposed on the absorber layer, a second barrier layer of a second semiconductor material disposed on the first barrier layer, a third barrier layer of a third semiconductor material disposed on the second barrier layer, a contact layer disposed on the third barrier layer. The third semiconductor material may comprise an aluminum alloy with aluminum cation fraction less than 80%. The third barrier layer may comprise $Al_{0.7}In_{0.3}As_{0.4}Sb_{0.6}$. The third barrier layer thickness may be 15 nm. The third barrier layer may be doped, the second barrier layer may be doped and the doping of the second layer is greater than the doping of the third layer.

In an alternative embodiment, a compound barrier infrared photodetector may comprise: a photo absorber layer responsive to infrared light, a first barrier layer disposed on the absorber layer, a second barrier layer disposed on the first barrier layer, a contact layer disposed on the second barrier layer. The absorber layer, the first barrier layer, the second barrier layer and the contact layer may comprise semiconductor alloys whose constituents are chosen from one or more elements of Zn, Cd, and Hg and one or more elements of S, Se, and Te. Furthermore, at least one semiconductor alloy substantially comprises HgCdZnSSeTe.

BRIEF DESCRIPTION OF THE DRAWINGS

The accompanying drawings, together with the specification, illustrate exemplary embodiments of the present invention, and, together with the description, serve to explain the principles of the present invention. The accompanying drawings use the same last two digits for the reference numbers of the same components. Hence absorber layer 930 in FIG. 9 is the same as absorber layer 530 in FIG. 5.

FIG. 1 shows the structure of a prior art infrared photodetector element of a focal plane array.

FIG. 2A shows the energy band diagram of the structure in FIG. 1 at zero bias.

FIG. 2B shows the energy band diagram of the structure in FIG. 1 at a reverse (negative) bias on the contact.

FIG. 3 shows the energy band diagram of the compound barrier infrared photodetector according to the principles of the present invention in the region under a contact, with a reverse (negative) bias applied to the contact.

FIG. 4 shows the energy band diagram of the compound barrier infrared photodetector according to the principles of the present invention in the region not under the contact.

FIG. 5 shows the structure of the compound barrier infrared photodetector according to the principles of the present invention FIG. 6A shows a 3 by 3 pixel focal plane array from the top comprising a plurality of compound barrier infrared photodetectors.

FIG. 6B shows a side view of the focal plane array in FIG. 6A along section line A-A, enlarged.

DETAILED DESCRIPTION

Figure 7:
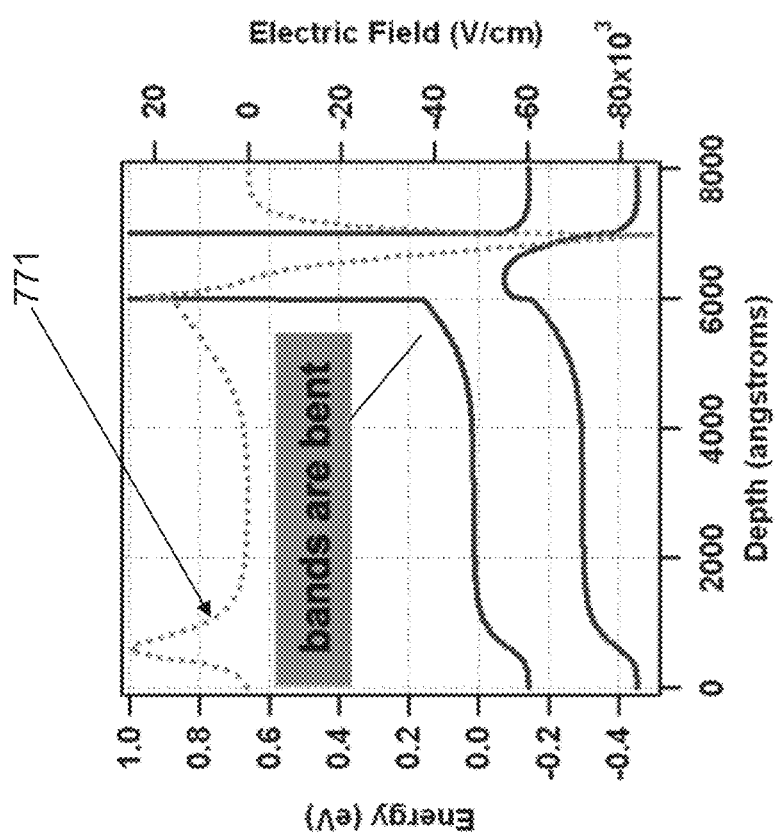
FIG. 7 shows an energy band diagram for prior-art nBn device structure with a doped barrier layer. The dotted curve in the figure represents the electric field, whose value is read off of the right axis.

The following papers are incorporated by reference as though fully set forth herein: U.S. Pat. No. 7,687,871 Reduced Dark Current Photodetector by Shimon Maimon, issued 30 Mar. 2010.

In the following detailed description, only certain exemplary embodiments of the present invention are shown and described, by way of illustration. As those skilled in the art would recognize, the described exemplary embodiments may be modified in various ways, all without departing from the spirit or scope of the principles of the present invention. Accordingly, the drawings and description are to be regarded as illustrative in nature, and not restrictive.

The problems described in the background section are at least partially solved by the principles of the present invention, including, by using a multiple layer barrier structure where each layer may be doped or undoped. The structure of an embodiment of the principles of the present invention uses a barrier structure comprising multiple layers, chosen to present a non-zero valence band energy barrier so as to suppress dark current and minority carrier recombination in peripheral regions of the device. An embodiment of the principles of the present invention is also based on the use of narrower-bandgap alloys in the barrier layer which can be controllably doped.

Prior-art designs of "nBn" photodetectors are based on a structure that is summarized in FIG. 1. The device consists of three distinct layers: an "Absorber" layer 130 in which photogeneration of minority carriers occurs due to absorption of incoming photons, a "Barrier" layer 120 that blocks the flow of majority carriers, and a "Contact" layer 110 that facilitates recombination of minority carriers and connection to a metal contact layer to complete an external circuit.

The primary characteristic to this design in FIG. 1 is that the combination of materials for the absorber layer 130 and barrier layer 120 are specifically chosen to provide a flat valence band (215 in FIG. 2A) that offers no barrier to minority carrier transport. A typical semiconducting material combination that meets this requirement, for instance, is $InAs_{0.91}Sb_{0.09}/AlAs_{0.09}Sb_{0.91}$. This design, while presenting no barrier to minority carrier transport from absorber layer 130 to contact layer 110 in the region under the contact 110 mesa, does not prevent minority carrier transport to the free surface of the exposed barrier layer 120 outside the contact layer 110. This lack of a barrier not only allows for recombination of bulk-generated minority carriers, but also does not prevent transport of surface generated minority carriers into the absorber layer 130, which could result in excess dark current.

FIG. 2A shows the energy bandgap of the prior art device without biasing of the contact layer 110 relative to the absorber layer 130. As mentioned above, the valence band 215 under the contact is flat. This is also the valence band present in peripheral regions outside the contact layer 110 because the barrier layer 120 is a semiconductor. FIG. 2B shows the energy bandgap under the contact 110 when the contact 110 is reverse biased. The valence band 215 presents no obstacle to minority carrier transport.

As shown in FIG. 7 for the prior art, a large electric field may be present in the absorber layer 130 due to doping difficulties in the wide-bandgap AlAsSb barrier layer. The field strength is shown by the line 771 in FIG. 7. The resultant band bending in the absorber layer 130 leads to excessive generation-recombination current due to the activation of deep states in the semiconductor bandgap. The wide bandgap (>1.7 eV) of the commonly-employed AlAsSb barrier layer 120 causes difficulty in controlling the electrical properties of the barrier layer 120 via conventional substitutional chemical doping. In particular, it is difficult to dope AlAsSb N-type.

Figure 8:
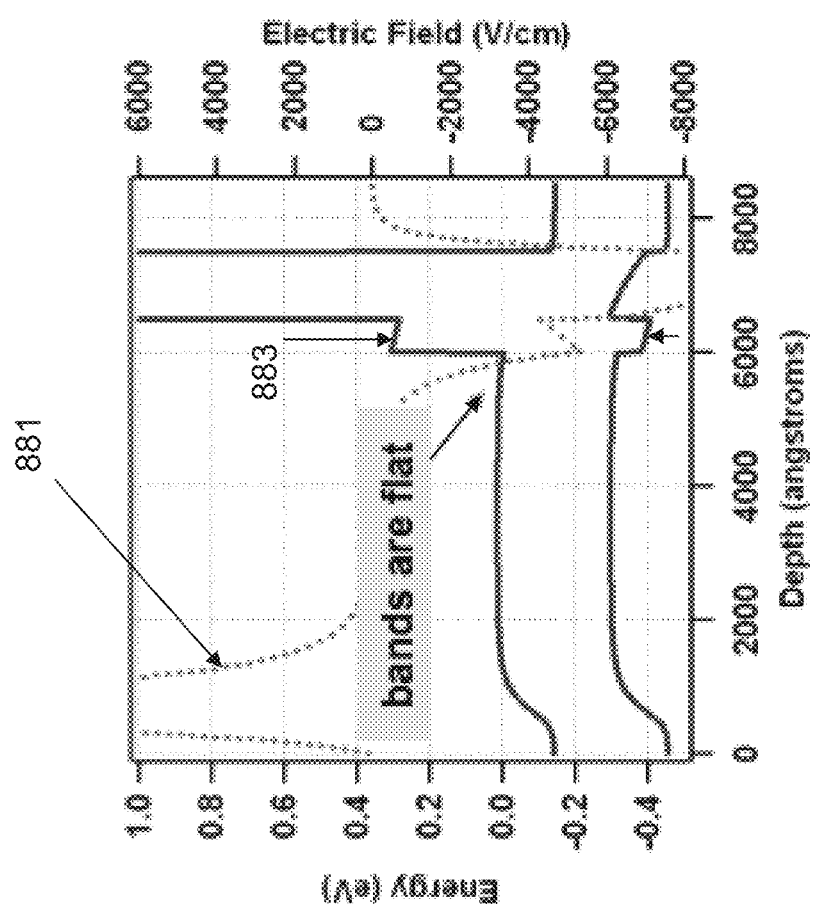
FIG. 8 shows energy band diagram for compound barrier infrared photodetector structure with optimally-doped barrier layer. The dotted curve in the figure represents the electric field, whose value is read off of the right axis.

As an alternative to use of wide-bandgap AlAsSb for the entire barrier layer 120, the present compound barrier infrared photodetector invention allows for use of an alternative narrower-bandgap interfacial barrier material that can be selected for its favorable valence band offset with respect to the absorber and for its ability to be controllably doped by conventional substitutional doping. FIG. 8 illustrates the benefit of this approach. The electric field strength is shown as the line 881 in FIG. 8. FIG. 8 shows the electric field strength 881 at the absorber/barrier interface is on the order of 8000 V/cm in the barrier region while FIG. 7 shows the corresponding electric field strength 771 is on the order of 20,000 V/cm. FIG. 8 also shows the bandgap 883 of an interfacial barrier layer disposed on the absorber layer is approximately 0.7 electron volts (ev). Preferred embodiments have an interfacial barrier layer bandgap 883 less than 1.5 ev.

By way of example and not limitation, the following embodiments are particularly suited for detecting light in the 0.5 micron to 20 micron wavelengths. Different material combinations will allow other wavelengths of light to be detected.

In the compound barrier infrared photodetector 500 shown in FIG. 5, the single barrier layer 120 of the prior art barrier designs is replaced with a combination of at least 2 barrier layers in the compound barrier infrared photodetector 500. FIG. 3 shows the energy band diagram under reverse bias in the region 527 under the contact 510. FIG. 4 shows the energy band diagram under the contact 510 with zero bias and the same diagram applies in the lateral region 525 outside the contact 510 when the contact 510 is reverse biased. Regions 527 and 529 are indicated in FIG. 5 with a dotted ellipse. As shown in FIG. 3, the barrier layer 528 is designed to present a minority carrier barrier 345 to minority carriers. In the region 527 of the compound barrier infrared photodetector 500 under the contact 510, the reverse bias that is applied to the compound barrier infrared photodetector 500 under normal operating conditions will remove the minority carrier barrier 345 to minority carrier transport allowing photogenerated minority carriers 344 to be collected with high quantum efficiency or attenuate the minority carrier barrier 345 sufficiently to allow transport. In the regions of the compound barrier infrared photodetector 500 outside the contact 110, region 529 in FIG. 5, the energy band diagram 400 of FIG. 4 applies. FIG. 4 shows the minority carrier barrier 445 presented by barrier layer 528 will still be present because no reverse bias is applied in this region 529. This minority carrier barrier 445 improves the performance of the detector by isolating the barrier 524 free-surface 525 from the bulk absorber 530. Minority carriers 442 generated in the absorber layer 530 are blocked by the minority carrier barrier 445, hence are unavailable to recombine at the surface.

The reverse bias voltage used to achieve the effects described with respect to FIGS. 3 and 4 is a reasonable voltage, typically on the order of one volt. However, depending on the thickness of the layers, any voltage may be reasonable as long as the voltage does not cause an electrical breakdown in the layers of the device 500.

Typical materials for the barrier layer 524 is $AlAs_xSb_{1-x}$ and for the barrier layer 528 in FIG. 5 is $Al_yIn_{1-y}As_xSb_{1-x}$. In one preferred embodiment the barrier layers comprise $AlAs_xSb_{1-x}$ where X is between 0 and 0.15 for the barrier layer 524, and X is between 0.05 and 0.30 and Y is between 0 and 1 for the barrier layer 528. The barrier layer 528 may be doped. Preferably the barrier layer 528 is N type and doped to a concentration substantially between 1.0E14 ($10^{14}$) and 1.0E18 ($10^{18}$) per $cm^3$. The barrier layer 524 is preferably undoped. In an alternative embodiment the barrier layer 524 may be doped N type to a concentration substantially between 1.0E14 and 1.0E18 per $cm^3$. Doping materials, by way of example and not limitation, may be silicon or tellurium.

In an alternative embodiment, the barrier layer 528 may be doped P type to a concentration substantially between 1.0E14 and 1.0E18 per $cm^3$. Doping materials, by way of example and not limitation, may be beryllium or carbon.

The thicknesses of the barrier layer 524 may be between 50 nm to 300 nm with 200 nm preferred in one embodiment. The barrier layer 528 may have a thickness between 10 nm and 200 nm with 15 nm preferred in one embodiment.

In an alternative embodiment, the order of the layers 524 and 528 may be switched with the barrier layer 524 between the barrier layer 528 and the absorber layer 530.

The embodiments described previously block the migration of minority carriers outside the region influenced by a biased contact 510 in FIG. 5, yet the same minority carrier barrier 445 is absent or attenuated in the region under the contact 510 when a reverse bias is applied to contact 510 where the minority carrier barrier 345 is operative. An embodiment of the compound barrier infrared photodetector 500 engineers the energy band diagram of the compound barrier infrared photodetector 500 such that the minority carrier barrier 345 is small enough to allow minority carriers to tunnel through the minority carrier barrier 345 when a reverse bias is applied to the contact layer, yet large enough in the lateral regions outside the contact area to block minority carrier transport.

Figure 9:
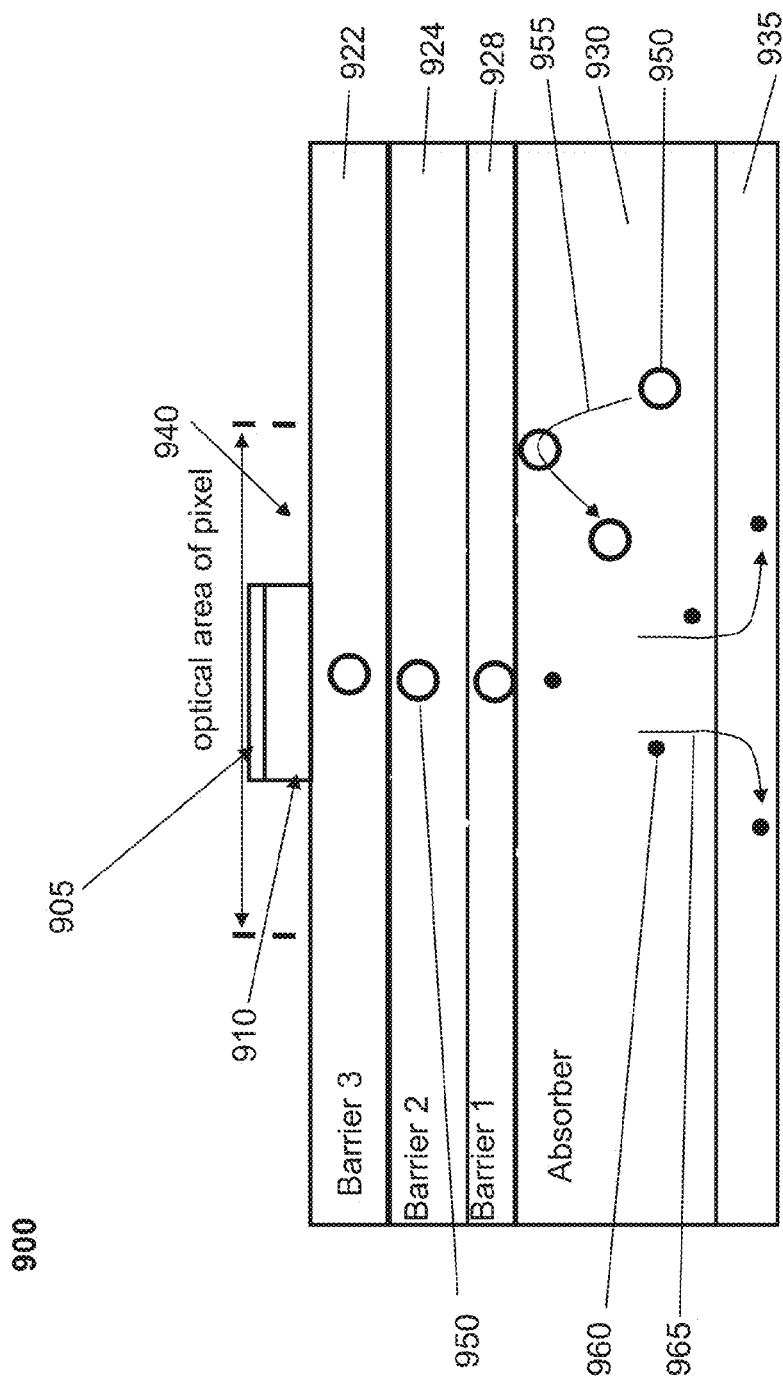
FIG. 9 illustrates a compound barrier infrared photodetector with three barrier layers.

In an alternative embodiment illustrated in FIG. 9, the barrier layers 524 and 528 may consist of 3 different layers 928, 924 and 922. These layers may be doped, undoped or compensation doped (to reduce the number of charge carriers below the number present naturally absent any doping). A first barrier 928, adjacent to the absorber 930, can be easily doped N-type or P-type to ensure flat band characteristics in the absorber 930. This barrier 928 can optionally have a minority carrier barrier 345 produced by a valence band offset in the case of a N-type absorber 930, or have a minority carrier barrier 345 produced by a conduction band offset in the case of a P-type absorber 930. In one embodiment the first barrier layer 928 comprises $Al_{0.3}In_{0.7}As_{0.7}Sb_{0.3}$ with a bandgap of 0.7 eV at 200 degrees K, with a minority carrier barrier with respect to an $InAs_{0.91}Sb_{0.09}$ absorber layer 930 at 200K of 0.065 eV, 0.4% mismatch in lattice constant with respect to an $InAs_{0.91}Sb_{0.09}$ absorber layer 930 and a critical barrier layer 928 thickness with respect to the $InAs_{0.91}Sb_{0.09}$ absorber layer 930 of approximately 30 nm The second barrier layer 924 is adjacent to the first barrier layer 928, with a large (>10 kT) conduction band offset as compared to the absorber layer 930, and serves to block the majority carriers in the absorber layer 930 and the contact layer 910.

The third barrier layer 922, which is located between the second barrier layer 924 and the contact layer 910, has a chemical composition such that it is stable and not prone to oxidation or degradation when exposed to the ambient air, and serves to cap and protect the second barrier layer 924. Exemplary materials for the third barrier layer 922 are Alloys with percentage Aluminum cation fraction less than 80%. These third barrier layers 922 provide better stability to oxygen in the environment as compared to alloys with 100% Al. In an exemplary embodiment, the third barrier material 922 is $Al_{0.7}In_{0.3}As_{0.4}Sb_{0.6}$ with a bandgap of 1.5 eV at 200 degrees K, a minority carrier barrier 345 with respect to an $InAs_{0.91}Sb_{0.09}$ absorber layer 930 at 200K of 0.075 eV, 0.6% mismatch in lattice constant with respect to the $InAs_{0.91}Sb_{0.09}$ absorber layer 930, and a critical layer thickness with respect to the $InAs_{0.91}Sb_{0.09}$ absorber layer 930 of approximately 15 nm.

The second barrier layer 924 can be doped or remain undoped. In one embodiment, the second barrier layer 924 is deliberately doped to a value slightly higher than the background doping of the third barrier layer 922. This predictable doping of the second barrier layer 924 enables one to design the doping level in the first barrier layer 928 to ensure flat-band conditions in the absorber layer 930. In one embodiment, the bandgap of the third barrier layer 922 may be smaller than that of the second barrier layer 924. In another embodiment, third barrier layer 922 can optionally have a minority carrier barrier 345 produced by a valence band offset as compared to the absorber layer 930 or the second barrier layer 924, in the case of an N-type absorber layer 930, or have a minority carrier barrier 345 produced by a conduction band offset in the case of an P-type absorber layer 930. One or more layers, 928, 924, 922 of the compound barrier may be either lattice matched or lattice mismatched and grown to a thickness less than the critical layer thickness in order to prevent the creation of dislocations.

In an alternative embodiment, the absorber layer 530, barrier layers 524, 528, and contact layer 510 are semiconductor alloys whose constituents are chosen from one or more elements chosen from Al, Ga, and In and alloyed with one or more elements chosen from N, P, As, and Sb In an alternative embodiment, the absorber layer 530, barrier layers 524, 528, and contact layer 510 are semiconductor alloys whose constituents are chosen from one or more elements of Zn, Cd, and Hg and alloyed with one or more elements of S, Se, and Te. A preferred alloy comprises HgCdZnSSeTe. In an alternative embodiment, the absorber layer 530, contact layer 510 and barrier layers 524, 528 may be doped N- or P-type.

In particular the absorber layer 530 may comprise a graded absorber layer 530 as described in U.S. Pat. No. 7,652,252 issued 26 Jan. 2010 titled "Electronically Tunable and Reconfigurable Hyperspectral Photon Detector", incorporated herein by reference.

In an alternative embodiment shown in FIGS. 6B and 9, a window layer 635/935 located adjacent to the absorber layer 630/930 on the light incidence side of the absorber layer 630/930, opposite the barrier layer 628/928, may be added. The window layer 635/935 is transparent to all wavelengths of light the detector is designed to detect, may have an offset in the valence or conduction band as compared to the absorber layer 530 that serves to block minority carriers generated in the absorber layer 530 from recombining at the light incident surface. This valence or conduction band offset produces the minority carrier barrier 445 in FIG. 4. Typical thicknesses of the window layer 635/935 are on the order of 100 nm. The window layer 635/935 may comprise the same material as the absorber layer 630/930 but is heavily doped. For an N doped absorber layer 630/930 the window layer 635/935 is N+ doped at a concentration of 1.0E17 to 1.0E18 per $cm^3$. For a P type absorber layer 630/930 the window layer 635/935 is heavily doped P type with a concentration of 1.0E17 to 1.0E18 per $cm^3$.

In addition to the surface-passivation benefit, the compound-barrier design offers the additional benefit of allowing the use of semiconductor materials with narrower bandgap, which improves the control of doping in the barrier layers 528, 524. In FIG. 7, the energy band diagram for a prior-art nBn device is displayed, which illustrates a limitation in the prior art design if the barrier layer cannot be doped at a level for a minimum electric field in the absorber layer.

The ability to controllably dope the barrier layer is critical for control of the electric field in the absorber layer of the device. With proper selection of the barrier doping, the electric field in the absorber layer can be minimized, which eliminates substantially all generation-recombination current contribution to the dark current. Specifically, the absorber layer in the vicinity of the barrier layer has to have a low electric field strength to minimize depletion of the absorber layer. Preferably the electric field strength is less than 10,000 v/cm. Depletion of the absorber layer can result in increased dark current (generation-recombination current)

The compound barrier infrared photodetector of FIG. 5 may be fabricated in an array of multiple compound barrier infrared photodetectors. FIG. 6A shows a top view of an array of compound barrier infrared photodetectors where the contact layer 610 for a pixel covers less than the entire area defining a pixel. A side view of section A-A in FIG. 6A is shown in FIG. 6B. Contact layer 610 occupies less than the entire area of a pixel and is topped with a metal ohmic contact 605. The region 640 between contact layers 610 is shown as exposed in FIG. 6 although in an alternative embodiment the region 640 may comprise a passivation or protection material. Typically the entire pixel area is not covered by the contact layer 610. The barrier layers 624 and 628 are as described for 524 and 528, respectively, for FIG. 5. Similarly the absorber layer 630 and contact layer 610 correspond to layers 530 and 510 in FIG. 5 respectively. FIG. 6B illustrates the location of Window layer 635.

FIG. 6B also illustrates the migration of minority carriers 650 under the contact 610, for example, per the band energy diagram 300 in FIG. 3. The blocking of minority carriers 650 outside the contact 610 is also shown. This behavior is, for example, per the band energy diagram 400 in FIG. 4. The majority carriers 660 migrate along the path 665 as shown in FIG. 6B.

The band energy diagrams 300 and 400 are for a device with an N-type absorber. As noted earlier, depending on the materials used for the contact, absorber and barrier layers, a pBp device based on a P-type absorber may be constructed. In such an embodiment, the principles described above are the same while the polarity or shape of the band energy diagram will change as familiar to those skilled in the art know.

Typical techniques to form the infrared photodetector devices 500, 600 and 900 include Molecular Beam Epitaxy.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. Other embodiments are within the scope of the claims. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . "

What is claimed is:

1. A compound barrier infrared photodetector comprising:
a photo absorber layer responsive to infrared light;
a first barrier layer disposed on the absorber layer;
a second barrier layer disposed on the first barrier layer;
a contact layer disposed on the second barrier layer;
wherein the first barrier layer substantially comprises $AlAs_zSb_{1-z}$, z is between 0 and 0.15; and
the second barrier layer substantially comprises $Al_yIn_{1-y}As_xSb_{1-x}$, y is between 0 and 1, x is between 0.05 and 0.30.

2. The compound barrier infrared photodetector of claim 1 wherein the second barrier layer is doped to a concentration between 1.0E14 and 1.0E18 per $cm^3$.

3. The compound barrier infrared photodetector of claim 2 wherein the doping is N type.

4. The compound barrier infrared photodetector of claim 2 wherein the first barrier layer is doped.

5. The compound barrier infrared photodetector of claim 1 wherein the second barrier layer is doped P type at a concentration of 1.0E14 to 1.0E18 per $cm^3$.

6. The compound barrier infrared photodetector of claim 1 wherein the second barrier layer thickness is between 10 nm and 200 nm.

7. The compound barrier infrared photodetector of claim 6 wherein the second barrier layer thickness is substantially 15 nm.

8. The compound barrier infrared photodetector of claim 1 wherein the first barrier layer thickness is between 50 nm and 300 nm.

9. The compound barrier infrared photodetector of claim 8 wherein the first barrier layer thickness is substantially 200 nm.

* * * * *